United States Patent [19]

Jerome et al.

[11] Patent Number: 5,298,440
[45] Date of Patent: Mar. 29, 1994

[54] METHOD OF FABRICATION OF TRANSISTOR DEVICE WITH INCREASED BREAKDOWN VOLTAGE

[75] Inventors: Rick C. Jerome, Puyalup, Wash.; Brian McFarlane, Campbell; Frank Marazita, San Jose, both of Calif.

[73] Assignee: National Semiconductor Corporation, Santa Clara, Calif.

[21] Appl. No.: 8,054

[22] Filed: Jan. 22, 1993

Related U.S. Application Data

[63] Continuation of Ser. No. 503,419, Apr. 2, 1990, abandoned.

[51] Int. Cl.$^5$ .................................... H01L 21/265
[52] U.S. Cl. .................................... 437/32; 437/192; 437/193; 437/200; 148/DIG. 96; 257/557
[58] Field of Search .................. 437/31, 32, 200, 201, 437/59, 192, 193; 148/DIG. 96

[56] References Cited

U.S. PATENT DOCUMENTS

| | | |
|---|---|---|
| 3,955,269 | 5/1976 | Magdo et al. |
| 4,484,388 | 11/1984 | Iwasaki . |
| 4,507,847 | 4/1985 | Sullivan . |
| 4,536,945 | 8/1985 | Gray et al. . |
| 4,546,536 | 10/1985 | Anantha et al. ............. 357/35 |
| 4,573,256 | 3/1986 | Lechaton et al. ............. 357/34 |
| 4,609,568 | 9/1986 | Koh et al. . |
| 4,619,038 | 10/1986 | Pintchovski ............. 437/200 |
| 4,709,469 | 12/1987 | Hirao ............. 437/193 |
| 4,752,589 | 6/1988 | Schaber ............. 437/193 |
| 4,764,480 | 8/1988 | Vora . |
| 4,795,722 | 1/1989 | Welch et al. ............. 148/DIG. 147 |
| 4,829,025 | 5/1989 | Iranmanesh . |
| 4,849,344 | 7/1989 | Desbiens et al. ............. 148/DIG. 147 |
| 4,874,717 | 10/1989 | Neppl et al. ............. 437/59 |
| 4,897,364 | 1/1990 | Nguyen . |
| 4,902,640 | 2/1990 | Sachitano et al. ............. 437/193 |
| 5,071,778 | 12/1991 | Solheim ............. 148/DIG. 10 |
| 5,079,182 | 1/1992 | Ilderen et al. ............. 437/34 |
| 5,089,433 | 2/1992 | Anand et al. ............. 437/43 |

FOREIGN PATENT DOCUMENTS 2168845 6/1986 United Kingdom .................. 357/34

OTHER PUBLICATIONS

Sze "VLSI Technology" 1988 McGraw Hill Book Company, New York edited by Sze.
Brassington, et al., "An Advanced Single-Level Polysilicon Submicrometer BiCMOS Technology," *IEEE Trans. Elect. Devices*, (1989).
Momose, et al., "1 μm n-well CMOS/Bipolar Technology," *IEDM Transactions* (Feb. 1985) p. 217.
Kapoor, et al., "A High Speed High Density Single-Poly ECL Technology for Linear/Digital Applications" 1985 Custom Integrated Circuits Conference, 1985.
Gomi, et al., "A Sub-30psec Si Bipolar LSI Technology" *IEDM Technical Digest* (1988) pp. 744–747.
Takemura, et al., "BSA Technology for Sub-100mn Deep Base Bipolar Transistors" *IEDM Technical Digest* (1987), pp. 375–377.
Chiu, et al., "A Bird's Beak Free Local Oxidation Technology Feasible to VSLI Circuits Fabrication" *IEEE Transactions on Electron Devices*, vol. ED-29, No. 4, pp. 536–540, Apr., 1982.

*Primary Examiner*—Olik Chaudhuri
*Assistant Examiner*—Long Pham
*Attorney, Agent, or Firm*—Townsend and Townsend

[57] ABSTRACT

A bipolar lateral device is disclosed having a high $BV_{ceo}$. The device is formed according to a single polysilicon process. In one embodiment silicide is excluded from the surface of the N+ doped polysilicon protecting the N- base width region of the device and the resulting device has a $BV_{ceo}$ of 8 to 10 V. In another embodiment, the silicide is excluded from the surface of the polysilicon protecting the n-base width region and the polysilicon is maintained as intrinsic polysilicon. The resulting device has a $BV_{ceo}$ of about 20 V. The devices are useful as voltage clamping devices in programmable logic circuits which must withstand a collector to emitter reverse bias voltage that is sufficient to program either vertical fuse or lateral fuse devices.

11 Claims, 11 Drawing Sheets

METHOD OF FABRICATION OF TRANSISTOR DEVICE WITH INCREASED BREAKDOWN VOLTAGE

This is a continuation of application Ser. No. 07/503,419, filed Apr. 2, 1990, now abandoned.

BACKGROUND OF THE INVENTION

The present invention relates to the field of semiconductor devices and their manufacture. More specifically, in one embodiment the invention provides bipolar devices having high breakdown voltages.

Bipolar devices such as those of the present invention are commonly combined with other devices such as a p-channel metal-oxide semiconductor (PMOS). In one embodiment, PMOS devices are fabricated along with n-channel metal-oxide semiconductors (NMOS) devices to produce complementary metal-oxide semiconductor (CMOS) devices. Bipolar and CMOS devices are fabricated together to produce "BiCMOS" devices. BiCMOS devices offer the advantages of the high packing density and low power consumption of CMOS devices, as well as the high speed of bipolar devices. One BiCMOS device and process for fabrication thereof is described in U.S. Pat. No. 4,764,480 (Vora), assigned to the assignee of the present invention and incorporated herein by reference for all purposes.

One form of a bipolar device is a lateral PNP bipolar device. A common use of such a bipolar lateral device is as a voltage clamping device in programmable logic array (PLA) circuits. Programmable logic array circuits are programmed by providing a reverse bias voltage sufficiently high to program a vertical fuse or lateral fuse in components of the circuitry. However, it is desired that the voltage clamping devices be left unaffected by the reverse bias voltage during programming. Thus, the voltage clamping devices in PLA circuits must withstand a collector-to-emitter reverse bias voltage which is sufficient to program vertical fuse or lateral fuse devices. For this reason, it would be advantageous for a bipolar lateral devices to have a $BV_{ceo}$ value greater than the reverse bias voltage used to program a PLA circuit.

SUMMARY OF THE INVENTION

The present invention includes recognition of certain problems encountered in previous devices. Previous single polysilicon processes have resulted in bipolar lateral transistors in which the $BV_{ceo}$ of the bipolar lateral device is clamped at about 5.8 V. However, this value is equal to or close to the $BV_{ebo}$ value of a standard vertical bipolar device. Accordingly, it is desirable to produce a bipolar lateral device, which has an increased $BV_{ceo}$, such as, for example a $BV_{ceo}$ greater than about 5.8 volts. According to one embodiment of the invention, a bipolar lateral PNP device is provided which has $BV_{ceo}$ of, for example, greater than about 5.8 volts, preferably greater than or equal to about 8 volts. According to a second embodiment, a bipolar lateral device is provided which has a $BV_{ceo}$ of, for example, greater than or equal to about 20 volts. By providing such high-$BV_{ceo}$ bipolar lateral devices, it is possible to obtain voltage clamping functions which are not affected by the reverse bias voltage used in programming a PLA circuit.

The bipolar devices disclosed herein can be fabricated in combination with CMOS devices to produce an improved BiCMOS device. The invention provides devices which have improved performance, reduced size, and/or which may be fabricated more quickly and economically.

In one embodiment the invention comprises doping regions of a semiconductor to produce collector, emitter, and base regions. Polysilicon is positioned on the surface of the substrate adjacent the collector, emitter, and base regions. The polysilicon adjacent the collector and emitter regions is doped with a dopant of a first conductivity type and polysilicon adjacent the base is doped with a dopant of a second conductivity type. Metal silicide is formed over the polysilicon adjacent the collector and emitter while the polysilicon adjacent the base is free of metal silicide. The device has a $BV_{ceo}$ of at least about 8 V, preferably at least about 10 V. In another embodiment, the device is formed in substantially the same manner except that the polysilicon which is adjacent the base region is provided in a substantially intrinsic state. In this embodiment, the device preferably has a $BV_{ceo}$ of at least about 20 V.

A further understanding of the nature and advantages of the inventions herein may be realized by reference to the remaining portions of the specification and the attached drawings.

DESCRIPTION OF THE PREFERRED EMBODIMENTS

Contents

I. General
II. Fabrication Sequence of Bipolar Devices
III. Device Performance

I. General

Figure 1A:
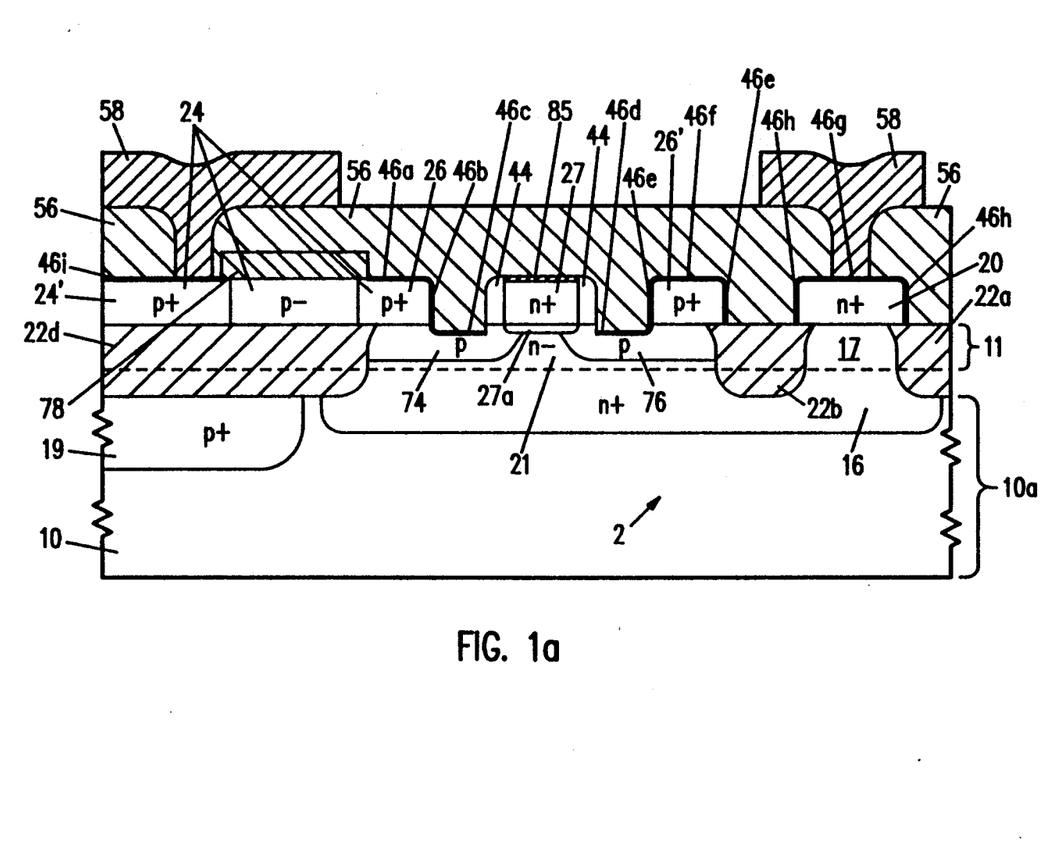
FIG. 1A is a cross-section of a bipolar structure according to first embodiment of the invention with the polysilicon over the base being n type.

FIG. 1A illustrates a bipolar device in cross-section according to one embodiment of the invention. The device includes a bipolar transistor 2 (which in the embodiment shown in FIG. 1 is a lateral PNP transistor). The device is fabricated on a substrate 10 which includes a single-crystal body 10a and an epitaxial layer 11. In the embodiment shown in FIG. 1 the substrate is a p-substrate having a dopant concentration of between about $1 \times 10^{13}$ and $1 \times 10^{16}$ with a preferred range of between about $2 \times 10^{14}$ and $3 \times 10^{15}/cm^3$. The reduced pressure doped n-type epitaxial silicon 11 is grown on top of the single-crystal body 10a. The devices are fabricated within the epitaxial layer 11.

The transistor 2 is provided with a heavily doped buried layer 16 and sink 17, which together provide a low resistance connection region between a base contact 20 and the base 21. In preferred embodiments the buried layer 16 and sink 17 are doped to a concentration of between about $1 \times 10^{17}$ and $1 \times 10^{20}$ with a preferred range of about $5 \times 10^{18}$ to $1 \times 10^{20}$/cm$^3$. The base region 21 has a dopant concentration preferably about $1 \times 10^{16}$.

P-doped regions 74, 76 formed in the epitaxial layer 11 act as the emitter and collector of a lateral PNP device. A lightly-doped n-type diffused region 27a is formed between the emitter 74 and the collector 76 as a result of down-diffusion from the n+ doped polysilicon region 27 during processing.

A well-known p+ channel stop 19 is provided between the transistor and adjacent devices to prevent surface inversion of the lightly doped substrate which would short circuit the buried layer 16 with adjacent devices. Between the transistor 2 and adjacent devices, oxide isolation regions 22a, 22b, and 22d, which typically will be SiO$_2$ are provided for device isolation. Viewed from the top of the structure, these oxide isolation regions connect to each other to form annular bands around the active device areas.

Along the surface of the device are polycrystalline silicon (polysilicon) regions forming, a resistor 24, emitter contact 26, which also functions as an end contact portion of the resistor 24, a polysilicon region 27 overlying the base 27a, a collector contact 26' and base contact 20. Sidewall oxide 44 is provided on the sidewalls of the polysilicon 27 which overlies the base. The polysilicon resistor 24, emitter contact 26, polysilicon adjacent the base 27, collector contact 26', and base contact 20 are formed from a single layer of deposited polysilicon which is doped and etched as described more fully below.

Refractory metal silicide contacts 46a, 46b are formed on the upper surface and sidewall surface of the collector contact 26. Silicide 46c is formed on the surface of the epitaxial region adjacent the collector 74 and extends to the sidewall oxide 44. Preferably, the collector contact silicide layers 46a, 46b, 46c are continuous. Similarly, refractory metal silicide contacts 46f, 46e are formed on the upper surface and sidewall surface of the emitter contact 26'. Silicide 46d is formed on the surface of the epitaxial region adjacent the emitter 76. Preferably, the emitter contact silicide 46d, 46e, 46f is continuous. Silicide 46g, 46h is formed on the upper surface and sidewall surface respectively, of the base contact 20. Silicide 46i is also formed on the upper surface of the p+ doped polysilicon 24' which forms the end contact portion of the resistor 24 opposite the emitter contact 26. The refractory metal contacts shown herein reduce the resistivity of the adjacent poly contacts and, therefore, increase the speed of the device.

The structure further includes a thick (0.8 to 1.3 and preferably about 1.3 µm) oxide layer 56 to insulate the devices from metal layer 58, used for interconnection purposes. Metal contacts similar to the contacts 58 shown can also be provided for, e.g., connecting to the polysilicon overlying the base (the base contact) 27, but are not seen in the particular cross-section shown.

Figure 1B:
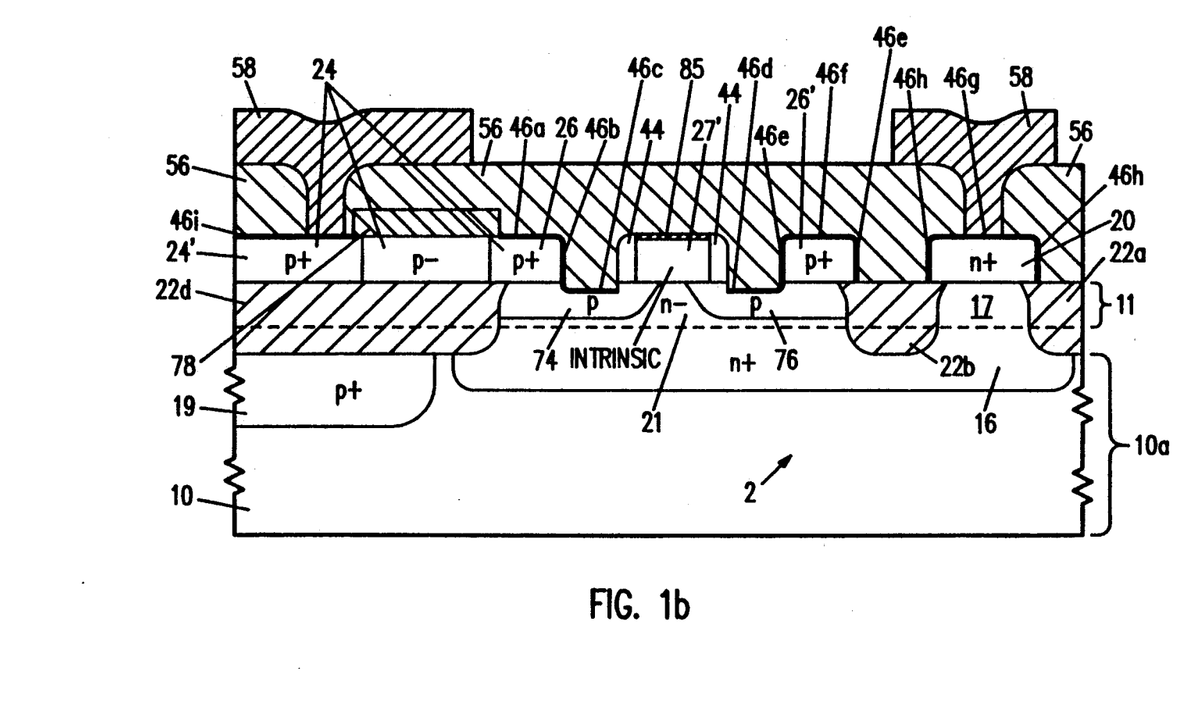
FIG. 1B is a cross-section of a bipolar structure according to a second embodiment of the invention with the polysilicon over the base being intrinsic.

FIG. 1B illustrates a bipolar device in cross-section according to a second embodiment of the invention.

FIG. 1B is similar to FIG. 1A except that the polysilicon overlying the base, 27', is intrinsic, rather than n+ type and, consequently, there is no region corresponding to region 27a of FIG. 1A, since there will be no down-diffusion from the intrinsic polysilicon 27'.

II. Fabrication Sequence of Bipolar Devices

Figure 2A:
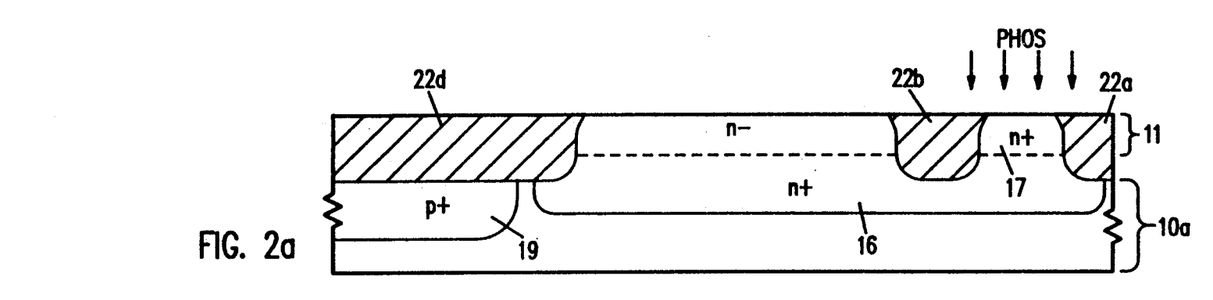
FIGS. 2A to 2L illustrate fabrication of the bipolar device according to a first embodiment of the invention.

FIGS. 2A through 2N illustrate fabrication of the bipolar device shown in FIG. 1A. In particular, FIG. 2A illustrates a cross-section of the devices at a first stage of their fabrication. To reach this stage, the single-crystal body 10a was masked for formation of the buried layer 16 with arsenic, antimony, or the like. The implant energy used for formation of region 16 is preferably about 50 to 100 keV with a preferred range of between about 70 to 80 keV such that the dopant concentration of region 16 is between about $5 \times 10^{17}$ to $2 \times 10^{20}$ with a preferred range of between about $1 \times 10^{19}$ and $1 \times 10^{20}$/cm$^3$.

After formation of the n+ region 16, the device is then masked for formation of the p+ channel stop 19. The implant energy used in formation of the region 19 is preferably between about 10 and 200 keV with a preferred range of 50 to 150 keV such that the dopant concentration of the p+ buried layers is between about $1 \times 10^{17}$ and $1 \times 10^{18}$/cm$^3$. The p+ region preferably is doped with boron.

The buried layer/channel stop mask is then removed and, using well-known techniques, a reduced pressure, n-type epitaxial silicon layer 11 having a thickness of about 1.1 µm is grown across the surface of the single-crystal body 10a. After depositing sandwiched layers of oxide and nitride, a photoresist mask is then formed over the surface so as to define field oxide regions 22a, 22b and 22d. The oxide regions are formed using a modified sidewall masked isolation ("SWAMI") process. The SWAMI process is described, e.g., in Chin, et al *IEEE Transactions on Electron Devices*, Vol ED-29, No. 4, April 1982, pp. 536–540. In some embodiments, the process is modified as described in co-pending application Ser. No. 07/502,943 incorporated by reference.

Thereafter, a grown screen oxide layer having a thickness of about 250 Å is formed on the surface of the substrate and a mask is formed, exposing only the sink region 17. A sink implant using an implant energy of about 100 and 190 keV with a dose of between about $1 \times 10^{14}$ and $1 \times 10^{16}$ using phosphorus as a dopant. The resulting dopant concentration in the sink region 17 is between about $1 \times 10^{19}$ and $1 \times 10^{20}$/cm$^3$. The sink is then annealed and driven-in by heating with a conventional thermal cycle in nitrogen.

Figure 2B:
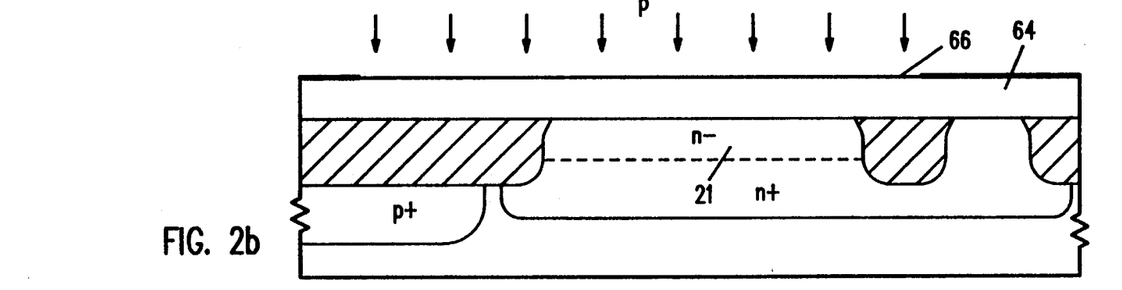

FIG. 2b illustrates the next sequence of process steps. A layer of intrinsic polysilicon 64 having a thickness of about 1,000 to 4,000 and preferably about 3,200 Å is deposited across the surface of the substrate and a cap oxide layer 66 is formed by thermal oxidation of the polysilicon layer 64.

In some embodiments in which the integrated circuit contains both lateral PNP devices and lateral NPN devices, a base implant procedure is performed while masking those devices which are not subjected to a base implant. When a base implant step is performed, the devices are masked with photoresist to expose at least the base region of some of the bipolar transistors and the lightly doped region of the resistor. Next, the base implant is performed and the base is annealed. In preferred embodiments the base implant uses an energy of between about 30 and 100 keV, with an implant energy of between about 30 and 50 preferred. The dose of this implant is preferably about $3 \times 10^{13}/cm^3$ and $8 \times 10^{13}/cm^3$. In preferred embodiments the anneal is performed by heating the structure to 950° C. for 45 minutes, and results in a base region 21 having a thickness of between about 1,000 and 2,000 Å with a dopant concentration of between about $1 \times 10^{18}$ and $1 \times 10^{19}/cm^3$, with a dopant concentration of about $5 \times 10^{18}/cm^3$ preferred.

Figure 2C:
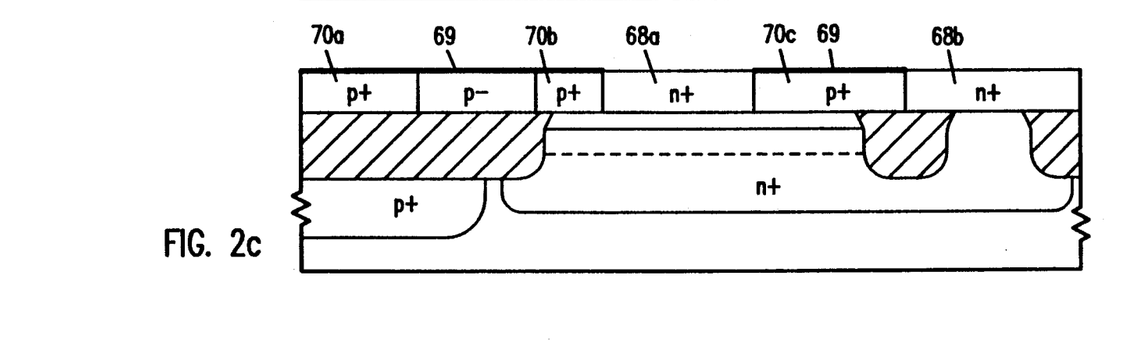

Thereafter a mask (not shown) is formed which exposes regions 70a, 70b, and 70c (FIG. 2c) which will eventually be a portion of the resistor, and the collector and emitter poly contacts. The regions are preferably doped p+ to a concentration of between about $1 \times 10^{19}$ and $1 \times 10^{20}/cm^3$ with a dopant concentration of about $6 \times 10^{19}/cm^3$ preferred using boron. The p+ mask is removed and another mask 69 is formed on the surface of the device to expose regions 68a and 68b, which will eventually be used as the polysilicon covering the base region, and the bipolar base contact. The regions 68 are doped n+ using an arsenic implant with an energy of about 100 keV to a concentration of between about $5 \times 10^{19}$ and $1 \times 10^{20}/cm^3$.

Figure 2D:
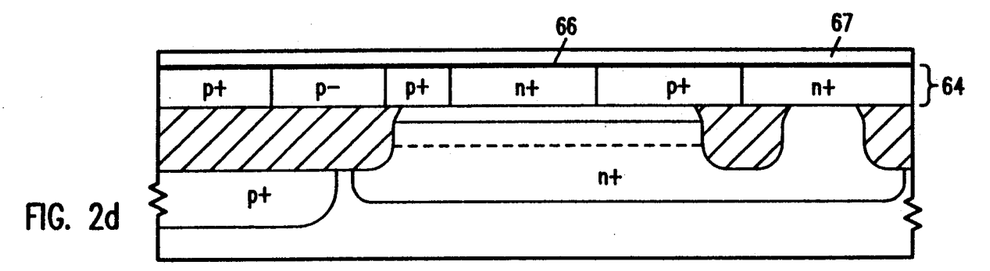

As shown in FIG. 2d, a layer of nitride 67 having a thickness of between about 1,000 and 1,200 Å is deposited for the purpose of preventing etch undercutting of the underlying polysilicon. The polysilicon layer 64 is then annealed at 900° C. for a time of about 15 minutes.

Figure 2E:
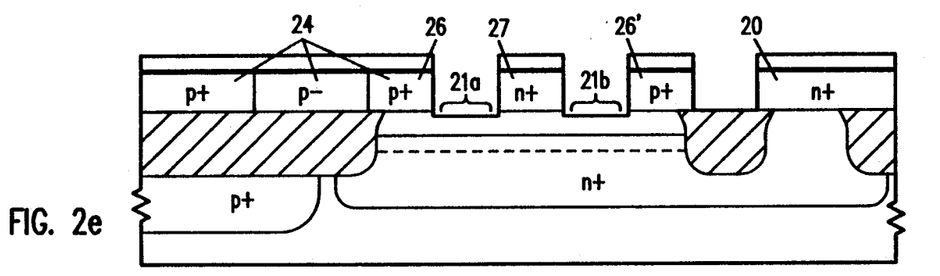

Next, a mask (not shown) is formed on the surface of the nitride to protect the base, emitter, and collector contacts 20, 26, 26' of the bipolar transistor, the poly overlying the base 27 and the resistor 24. A dry etch with chlorine chemistry results in the structure shown in FIG. 2e. As shown, the etch is conducted such that regions of the bipolar base 21a, 21b are etched below the original epitaxial surface by about 1000 Å to 2000 Å to reduce capacitance in the bipolar transistors.

Figure 2F:
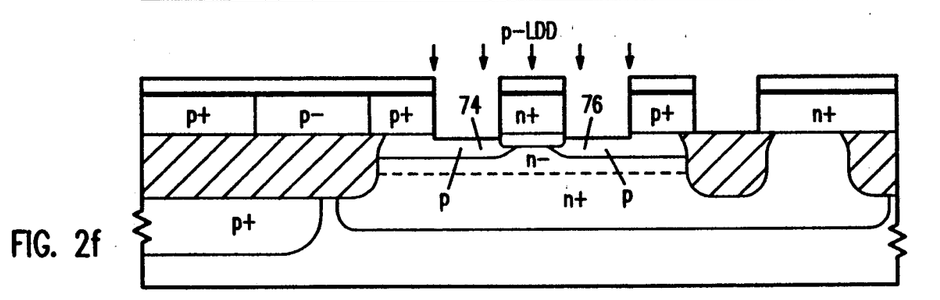

The etch mask is removed. After an oxidation step to grow a cap oxide, as illustrated in FIG. 2f, a p-type LDD using a dopant such as $BF_2$ is performed across the surface of the bipolar transistor base region of the bipolar transistor exposed by a mask. Heavily doped p-regions 74, 76 which are self-aligned are formed in the base contact of the bipolar transistor. The resulting net dopant concentration in the regions 74, 76 is between about $5 \times 10^{17}$ and $1 \times 10^{19}/cm^3$. The implant energy is preferably between about 40 and 60 keV.

Figure 2G:
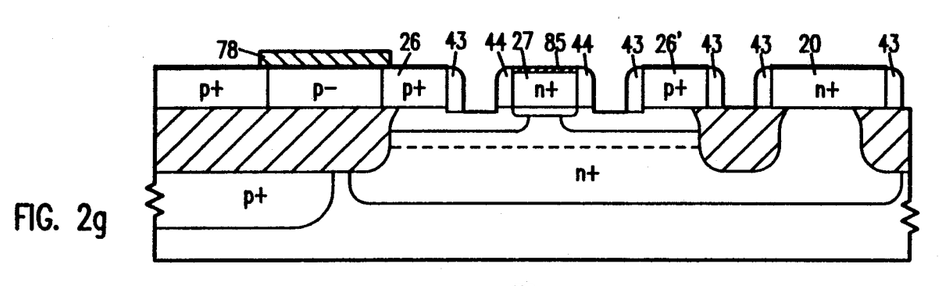
Figure 2H:
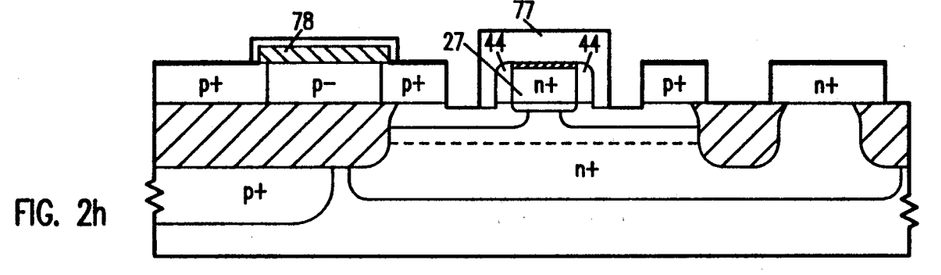

Referring to FIG. 2g, nitride is stripped from the surface of the device and a Low Temperature Oxide (LTO) deposition is performed. A silicide exclusion mask, not shown, is formed on the device on polysilicon regions where silicide formation is not desired (e.g., over the center portion 78 of the resistor and the upper surface of the polysilicon overlying the base 27). The oxide is then etched back, leaving oxide 85 on the upper surface of the polysilicon overlying the base 27 and leaving spacer oxide 43, 44 on exposed sides of the emitter, collector and base contacts 20, 26, 26' and the polysilicon overlying the base 27 using means known to those of skill in the art. Another mask 77 (FIG. 2h) is then formed over the device for protection of at least the resistor oxide 78, and the sidewall oxide 44 and upper surface oxide 85 on the polysilicon overlying the base 27 as seen in FIG. 2h. The device is etched with BOE for about 1 minute and, as shown in FIG. 2h, the oxide is removed from the sidewall of the emitter, and collector poly contacts.

Figure 2I:
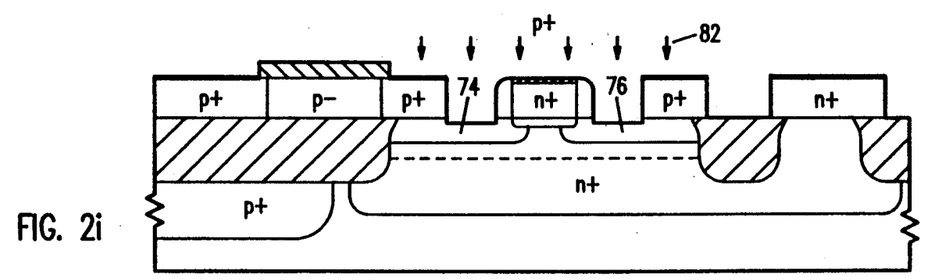

Referring to FIG. 2i, a mask is formed and a heavy p+ ($BF_2$) implant 82 is performed in the regions shown therein, i.e., in the collector emitter regions of the bipolar transistor 74, 76. The purpose of this implant is to further lower the resistance of those regions. The implant uses an energy of between about 40 and 60 keV.

Figure 2J:
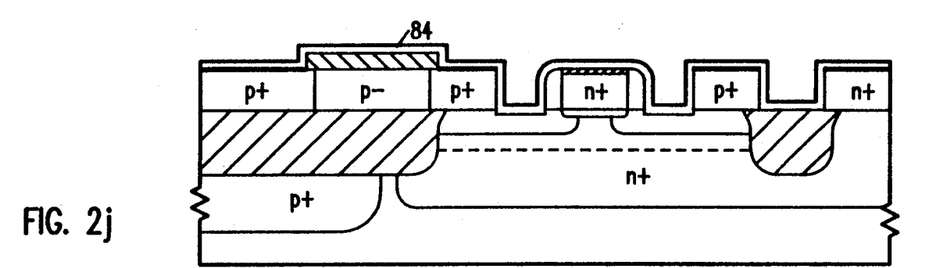
Figure 2K:
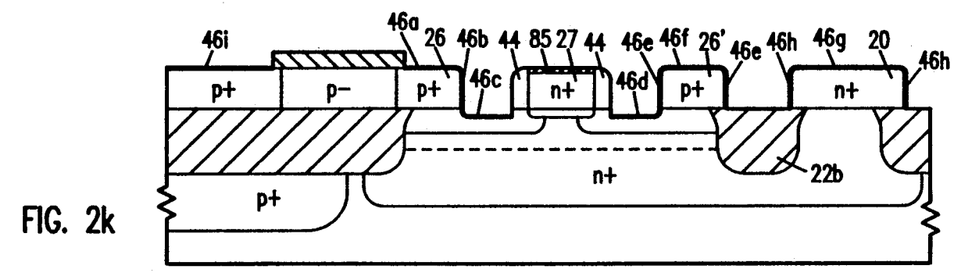

Next, as shown in FIG. 2j, a layer of refractory metal 84 such as titanium, molybdenum, tantalum, tungsten, or the like, is deposited across the surface of the device. Using means well known to those of skill in the art, the layer is heated to about 750° C. for about 10 seconds, preferably using a rapid thermal anneal (RTA). The heating results in formation of a metal silicide in regions where the deposited metal 84 is in contact with polysilicon. Remaining unreacted metal is then etched away from the device, e.g., using $H_2O_2$ or $NH_3OH$, leaving a structure as shown in FIG. 2k. As shown therein, the bipolar polysilicon collector and emitter contacts 26, 26' are covered with silicide 46a, 46b, 46e, 46f across their horizontal upper surfaces, and along their vertical sidewalls. In addition, the silicide contacts extend from the vertical sidewalls along the horizontal upper surface of the single-crystal base 46c, 46d fully up to the sidewall oxide 44 of the polysilicon 27 overlying the base. The silicide 46g, 46h on the base contact 20 extends up the vertical sidewall of the base contact and fully across the horizontal upper surface of the contact, terminating on the field oxide region 22b. The contact scheme disclosed herein provides reduced resistance through silicidation of the sidewall polysilicon contact, thereby increasing the current drive capability of the transistors and eliminating the polysilicon-silicon contact resistance. It is believed that sidewall silicidation of the local interconnects improves the resistance of the interconnect by a factor of about 2, thereby enhancing the circuit performance.

Figure 2L:
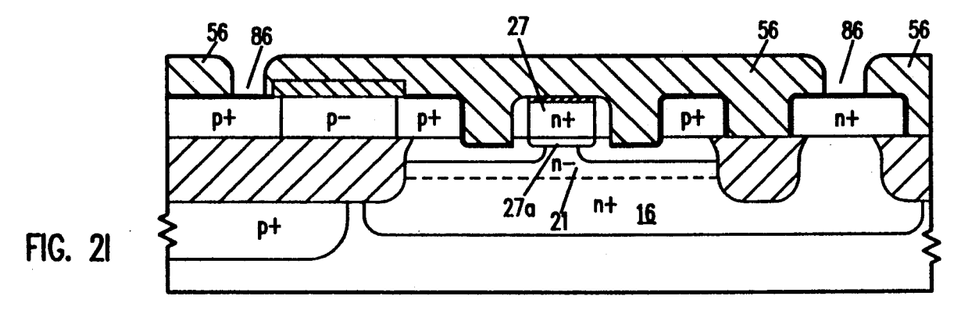

FIG. 2l illustrates the next step in the fabrication sequence in which oxide layer 56 is deposited and masked to form contact holes 86 therein. Metal is deposited on the surface of the device, masked, and etched from selected regions, providing the device shown in FIG. 1.

As can be seen from FIG. 2l, the bipolar device provided according to the disclosed invention has the silicide layer excluded from the upper surface of the N+ doped polysilicon protecting the n- base width region 21 of the device. During fabrication, and particularly during thermal cycles, an amount of arsenic diffuses across the interface between the underlying n-doped regions 16 and the polysilicon overlying the base region 27 into the n-type region 27a. It has been found that by excluding the silicide layer as disclosed, the arsenic diffusion which takes place does not travel as deep or result in as great an arsenic concentration in the region 27a as when a silicide layer is present. The resultant reduction in arsenic diffusion results in a higher $BV_{ceo}$. A device produced according to the disclosed invention yields a $BV_{ceo}$ of 8 to 10 V. The device has a peak current gain of about 10 for a 1.5 micron base width device. This device is suitable for emitter-coupled logic (ECL) PAL applications utilizing programmable lateral fuse devices.

Figure 3A:
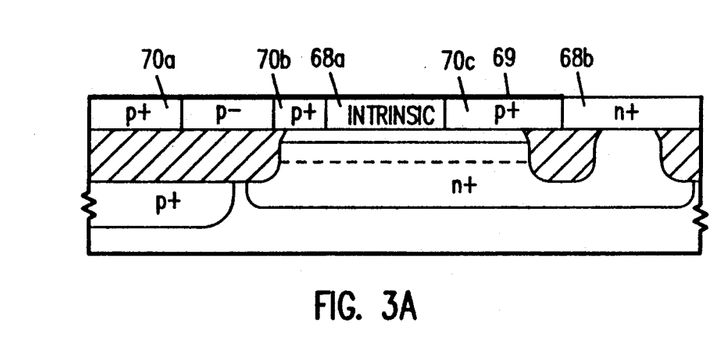
FIGS. 3A to 3J correspond to FIGS. 2C–2L, but show fabrication of a bipolar device according to a second embodiment of the invention.
Figure 3B:
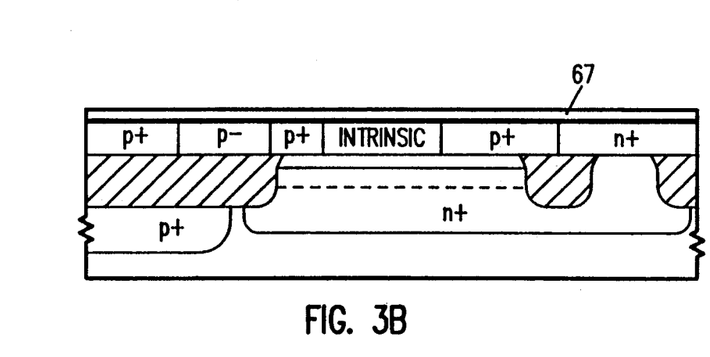
Figure 3C:
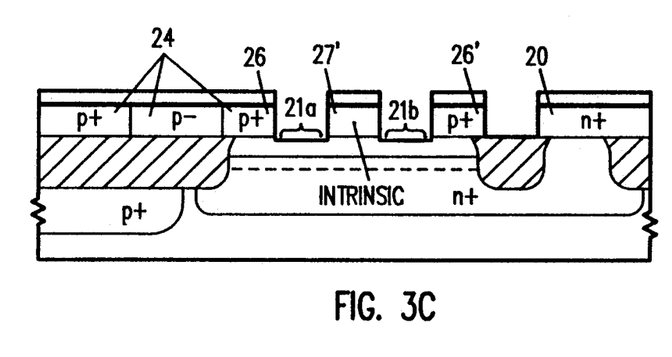
Figure 3D:
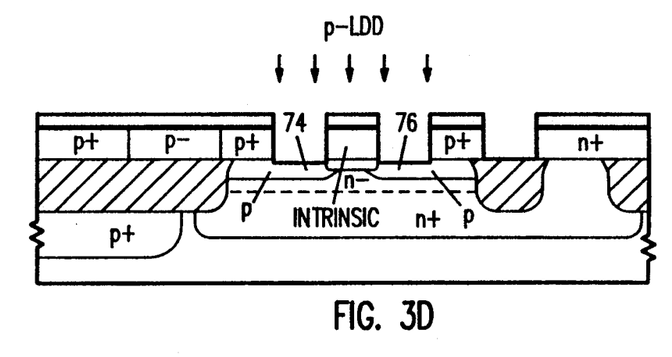
Figure 3E:
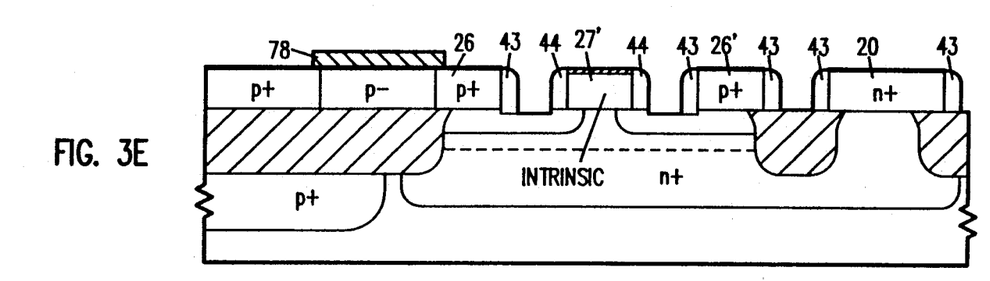
Figure 3F:
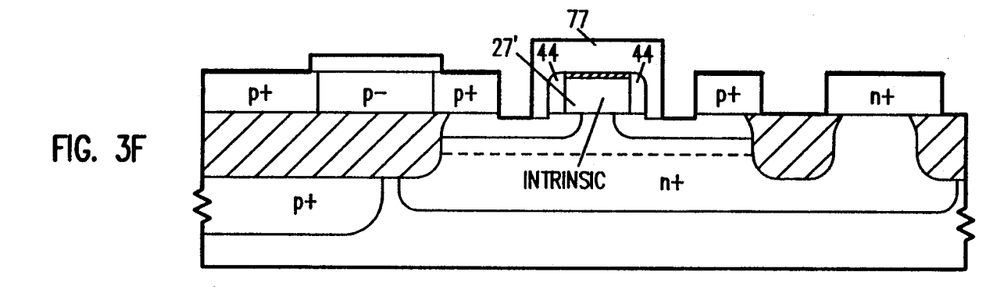
Figure 3G:
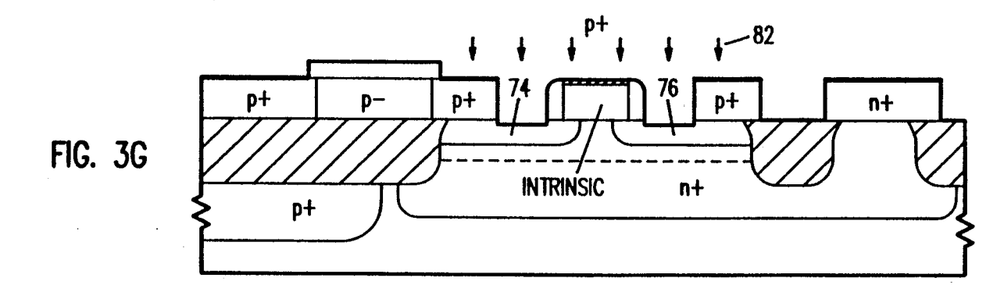
Figure 3H:
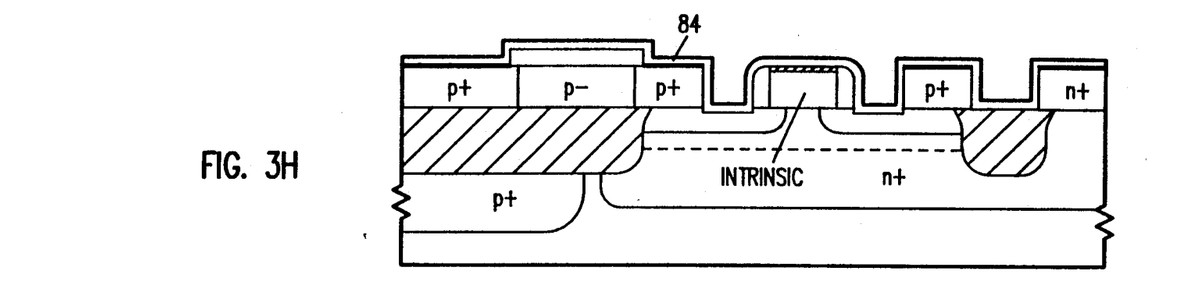
Figure 3I:
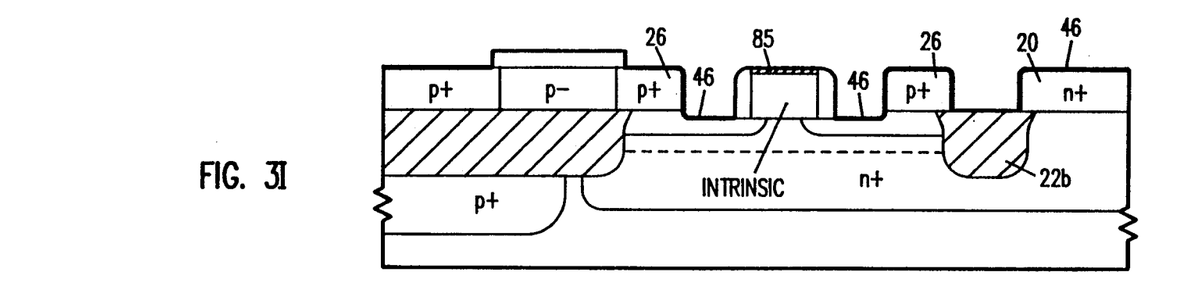
Figure 3J:
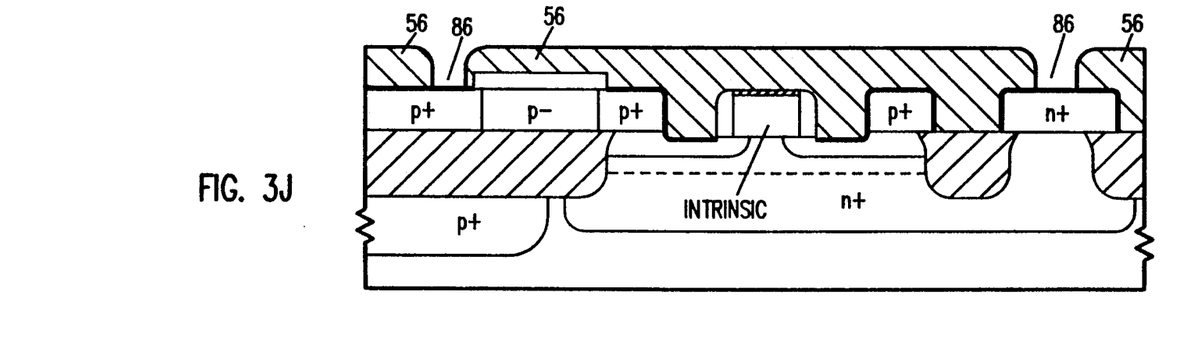

FIGS. 3A through 3J correspond generally to FIGS. 2c through 2l but illustrate a second embodiment of the invention. According to the second embodiment of the invention, the polysilicon region 27' residing in the base region is masked to prevent any doping so that it remains an intrinsic polysilicon region. Thus, comparing FIG. 3A to FIG. 2c, it can be seen that in this second embodiment the mask 69 is configured so that it does not expose the region of polysilicon 68a which will become the polysilicon adjacent the base 27. Thus, upon implanting with arsenic, region 68a remains as intrinsic polysilicon, while region 68b becomes n+ doped. Region 68a remains as intrinsic polysilicon throughout the remaining steps including formation of a layer of nitride 67 (FIG. 3B), masking and etching the polysilicon (FIG. 3E), p- type LDD (FIG. 3D), formation of sidewall oxides (FIG. 3E), etching to strip undesired sidewall oxide (FIG. 3F), heavy p+ implant 82 (FIG. 3G), deposition of refractory metal 84 (FIG. 3H), heating to form metal silicide (FIG. 3I), and deposition of an oxide layer 56 (FIG. 3J).

By maintaining the polysilicon region 27' in an intrinsic state, substantially no arsenic diffuses across the interface between the polysilicon region 27' and the adjacent doped epitaxial region 21, and thus there is no structure corresponding to region 27a of FIG. 1a. As a result, breakdown occurs as a floor breakdown rather than corner breakdown phenomenon. When both the n+ implant and silicide are removed from the polysilicon overlying the active base region of the device 27, the device typically yields a $BV_{ceo}$ of about 20 V which is equivalent to a standard vertical NPN $BV_{cbo}$ value. This is accomplished through a subsequent reduction in current gain on a device having a wider 2.0 micron base width, due to more recombination of holes along the intrinsic polysilicon-single crystal silicon interface. The peak current gain of this device is close to unity which is suitable for transistor-transistor logic (TTL) PAL circuits utilizing programmable vertical fuse devices.

III. Device Performance

Figure 4A:
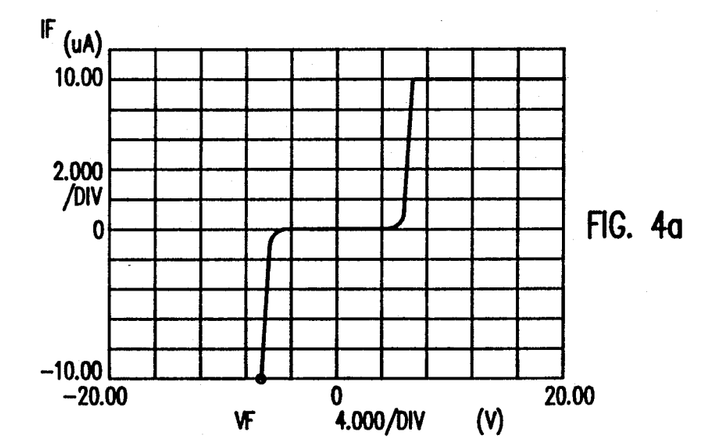
FIG. 4A depicts current versus voltage for a first device.
Figure 4B:
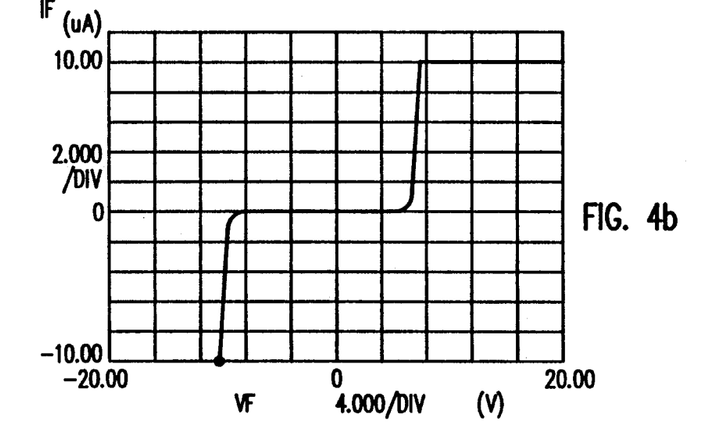
FIG. 4B depicts current versus voltage for a device according to the present invention with the n+ polysilicon overlying the base being unsilicided.
Figure 4C:
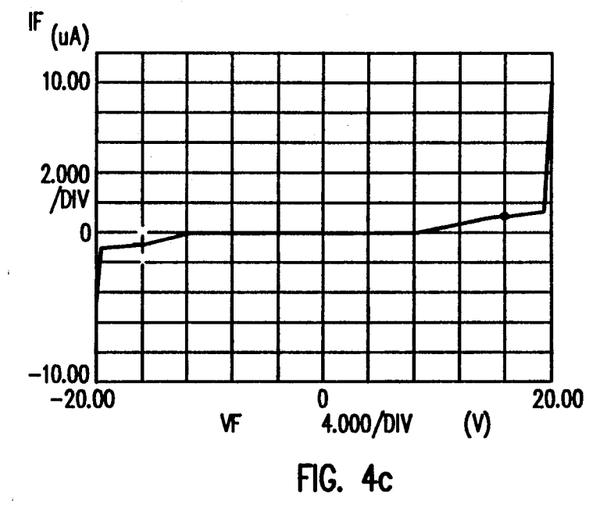
FIG. 4C depicts current versus voltage for a device according to the present invention with intrinsic, unsilicided polysilicon overlying the base.
Figure 5:
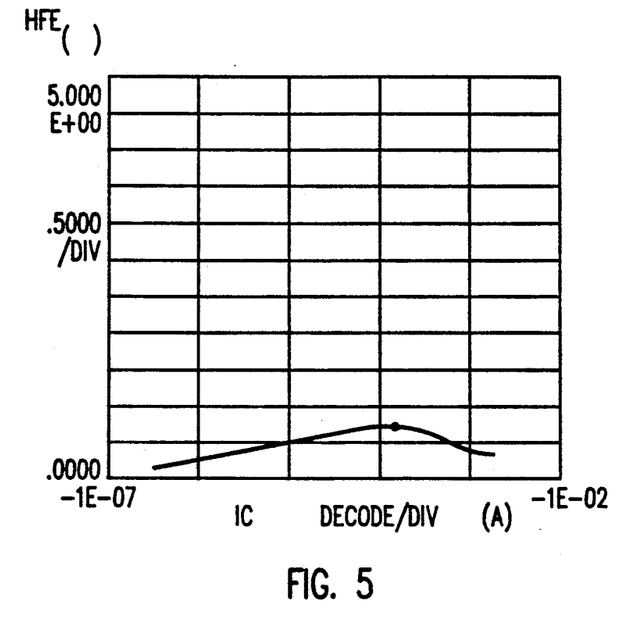
FIGS. 5 and 6 depict current gain versus collector current for devices according to the present invention.
Figure 6:
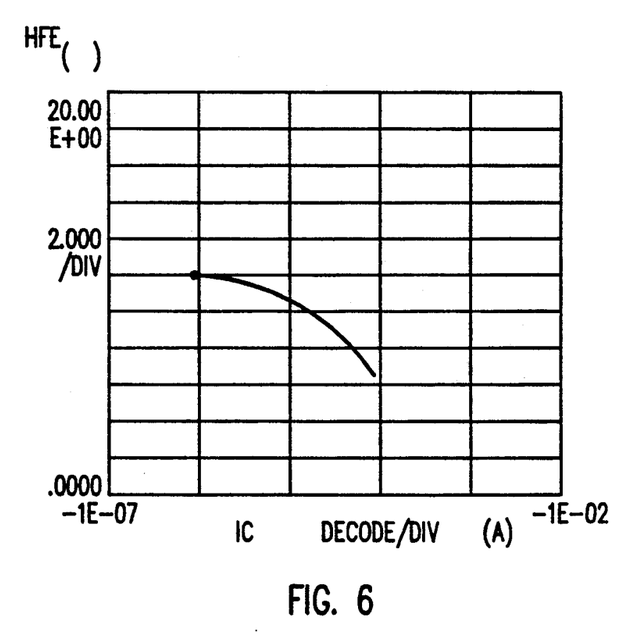

Bipolar devices were constructed according to the disclosed invention and subjected to voltages ranging from −20 volts to +20 volts while a resultant current was measured. The devices tested had a base width of about 1.5 to 2 microns. FIG. 4a depicts the measured currents in a device formed according to previous methods, in which the polysilicon overlying the base is silicided and n+ type. FIG. 4b depicts the measured currents in a device formed without silicide on the polysilicon adjacent the base region, but with the polysilicon being n doped, as depicted in FIG. 1a. FIG. 4c depicts the measured current in a device which has no silicide on the polysilicon overlying the base region and also in which the polysilicon overlying the base region is intrinsic, corresponding to FIG. 1b. FIG. 5 is a plot of current gain (designated HFE) as a function of collector current for a device in which the polysilicon adjacent the base region is doped and unsilicided (as in FIG. 1a). The current gain depicted in FIG. 5, in general, is similar to current gain obtained from previously available devices in which the polysilicon overlying the base region is silicided. FIG. 6 is a plot generally corresponding to FIG. 5, for a device having neither silicide nor doping in the polysilicon overlying the base region (as depicted in FIG. 1b).

In general terms, although previous devices have provided a $BV_{ceo}$ of about 6 volts, the corresponding value when there is no silicide on the polysilicon overlying the base region is about 7 to 10 volts, and when the polysilicon overlying the base region is intrinsic, about 20 volts. Current gain in previous devices is about 10 and remains about 10 in devices from which silicide is excluded in the polysilicon overlying the base region. The current gain when the polysilicon overlying the base region is intrinsic is about 1. These results are summarized in Table 1.

TABLE 1

| | Polysilicon Overlying Base Region | | |
|---|---|---|---|
| Silicided? | Doped or Intrinsic | $BV_{ceo}$ | Current Gain |
| Yes | Doped | 6 V | 10 |
| No | Doped | 7-10 V | 10 |
| No | Intrinsic | 20 V | 1 |

It is to be understood that the above description is intended to be illustrative and not restrictive. Many variations of the invention will become apparent to those of skill in the art upon review of this disclosure. Merely by way of example particular regions of the devices shown herein have been illustrated as being p-type or n-type, but it will be apparent to those of skill in the art that the role of n- and p-type dopants may readily be reversed. Further, while the invention has been illustrated with regard to specific dopant concentrations in some instances, it should also be clear that a wide range of dopant concentrations may be used for many features of the devices herein without departing from the scope of the inventions herein. Still further, while the inventions herein have been illustrated primarily in relation to a bipolar device, many facets of the invention could be applied when the bipolar devices are fabricated on a common substrate with PMOS, NMOS, and/or CMOS devices. The scope of the invention should, therefore, be determined not with reference to the above description, but instead should be determined with reference to the appended claims along with their full scope of equivalents.

What is claimed is:

1. A method of forming a lateral bipolar device, comprising:
   doping a first portion of a substrate to produce a collector region;
   doping a second portion of said substrate to produce an emitter region;
   doping a third portion of said substrate to produce a base region between said collector region and said emitter region;
   positioning polysilicon on the surface of said substrate at least in first, second, and third portions of the substrate to produce first, second and third polysilicon regions, said first region contacting said first portion of said substrate, said second region, laterally spaced from said first region and said third region, contacting said second portion of said substrate and said third region contacting said third portion of said substrate, said first, second and third polysilicon regions being deposited substantially simultaneously in a single polysilicon deposition step;
   doping said polysilicon in said first and second regions with a dopant of a first conductivity type;
   forming a metal silicide layer over said first and second polysilicon regions; and
   maintaining said third polysilicon region substantially free from a layer of metal silicide.

2. A method, as claimed in claim 1, further comprising doping said polysilicon in said third region with a dopant of a second conductivity type, different from said first conductivity type.

3. A method, as claimed in claim 1, wherein said doping of said collector and emitter regions is p-doping, to produce a lateral PNP device.

4. A method, as claimed in claim 1, wherein said device has a $BV_{ceo}$ of at least about 8 V.

5. A method, as claimed in claim 1, wherein said device has a $BV_{ceo}$ of at least about 10 V.

6. A method, as claimed in claim 1, further comprising:
    forming a layer of oxide on the surface of said third polysilicon region.

7. A method as claimed in claim 1, further comprising maintaining said polysilicon in said third region in a substantially intrinsic state.

8. A method, as claimed in claim 7, wherein said device has a $BV_{ceo}$ of at least about 20 V.

9. A method of forming a lateral PNP bipolar device on a substrate, comprising:
    n doping a first portion of said substrate to produce a base region;
    p doping a second portion of said substrate adjacent said n doped region to produce a collector region;
    p doping a third portion of said substrate adjacent said n doped region to produce an emitter region positioned such that said base region is between said collector region and said emitter region;
    positioning polysilicon on the surface of said substrate at least in said first, second, and third portions of said substrate to produce first, second and third polysilicon regions, said first region contacting said first portion of said substrate, said second region, laterally spaced from said first region and said third region, contacting said second portion of said substrate, and said third region contacting said third portion of said substrate, said first, second and third polysilicon regions being deposited substantially simultaneously in a single polysilicon deposition step;
    p+ doping said polysilicon in said third and second regions;
    forming a layer of oxide on the surface of said first polysilicon region;
    forming a metal silicide layer over said third and second polysilicon regions; and
    maintaining said first polysilicon region substantially free from a layer of metal silicide, wherein said device has a $BV_{ceo}$ of at least about 10 V.

10. A method, as claimed in claim 9, further comprising n+ doping said polysilicon in said third region.

11. A method, as claimed in claim 9, further comprising:
    maintaining said polysilicon in said third region in a substantially intrinsic state, wherein said device has a $BV_{ceo}$ of at least about 20 V.

* * * * *